United States Patent
Park

(10) Patent No.: US 8,667,810 B2
(45) Date of Patent: Mar. 11, 2014

(54) AIR CONDITIONING SYSTEM FOR COMMUNICATION EQUIPMENT

(75) Inventor: Hee Tae Park, Yongin-si (KR)

(73) Assignee: Chang Jo 21 Co., Ltd., Gyeonggi-Do (KR)

( * ) Notice: Subject to any disclaimer, the term of this patent is extended or adjusted under 35 U.S.C. 154(b) by 540 days.

(21) Appl. No.: 12/310,585

(22) PCT Filed: Sep. 15, 2006

(86) PCT No.: PCT/KR2006/003691
§ 371 (c)(1),
(2), (4) Date: Feb. 27, 2009

(87) PCT Pub. No.: WO2008/026791
PCT Pub. Date: Mar. 6, 2008

(65) Prior Publication Data
US 2010/0186442 A1    Jul. 29, 2010

(30) Foreign Application Priority Data
Sep. 1, 2006  (KR) .................. 10-2006-0084180

(51) Int. Cl.
*F25D 17/02*    (2006.01)
(52) U.S. Cl.
USPC ............................................. 62/434; 62/510
(58) Field of Classification Search
USPC ........... 62/434, 510, 513, 333, 335, 436, 428, 62/426, 407
See application file for complete search history.

(56) References Cited

U.S. PATENT DOCUMENTS

| | | | | |
|---|---|---|---|---|
| 4,328,673 A * | 5/1982 | Matthews | ............. | 60/641.4 |
| 4,342,197 A * | 8/1982 | Matthews | ............. | 60/641.4 |
| 4,380,903 A * | 4/1983 | Matthews | ............. | 60/641.4 |
| 4,407,140 A * | 10/1983 | Kobayashi | ............. | 62/268 |
| 5,142,883 A * | 9/1992 | DeWitt | ............. | 62/298 |
| 5,438,846 A * | 8/1995 | Datta | ............. | 62/238.7 |
| 6,263,696 B1 * | 7/2001 | Machizawa et al. | ............. | 62/476 |
| 6,389,827 B2 * | 5/2002 | Agekura et al. | ............. | 62/185 |
| 6,804,962 B1 * | 10/2004 | Prueitt | ............. | 60/641.8 |
| 6,967,842 B2 * | 11/2005 | Aoki et al. | ............. | 361/701 |
| 7,165,412 B1 * | 1/2007 | Bean, Jr. | ............. | 62/259.2 |
| 7,254,955 B2 * | 8/2007 | Otake et al. | ............. | 62/238.7 |

FOREIGN PATENT DOCUMENTS

| | | |
|---|---|---|
| JP | 09-250779 | 9/1997 |
| JP | 2001-41503 | 2/2001 |
| JP | 2004-293894 | 10/2004 |

* cited by examiner

*Primary Examiner* — Mohammad Ali
(74) *Attorney, Agent, or Firm* — The PL Law Group, PLLC

(57) ABSTRACT

An air conditioner for communication equipment is provided. The air conditioner includes an indoor module disposed at an indoor space of a base station having communication equipment and including an indoor heat exchanger and an indoor ventilator disposed closely to the indoor heat exchanger, an outdoor module disposed at an outside of the base station and including an outdoor ventilator, a brine cooling cycle including the indoor heat exchanger on a brine pipe, a brine pump, first and second outdoor brine heat exchanger, and first and second brine coolers, which are connected in a brine circulating direction, and a refrigerant cooling cycle including first and second expansion valves on a refrigerant pipe, the first and second brine coolers on the brine pipe, first and second compressors, first and second outdoor refrigerant heat exchangers, which are connected in a refrigerant circulating direction.

8 Claims, 5 Drawing Sheets

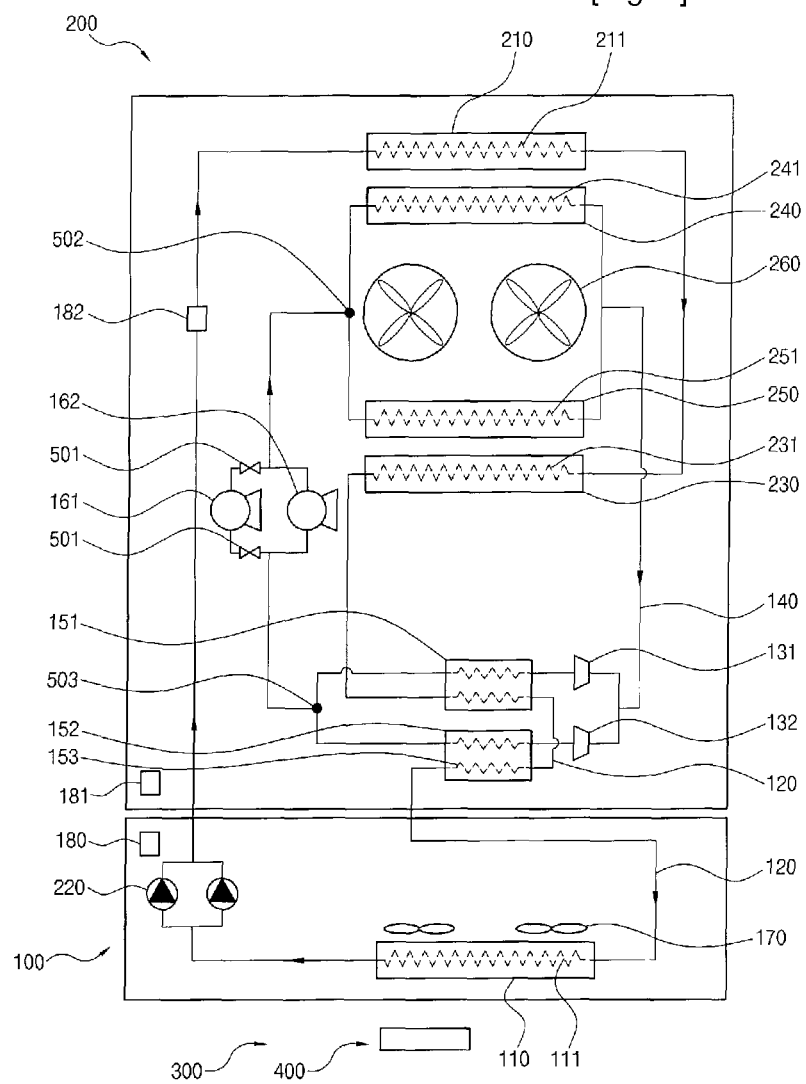
[Fig. 1]

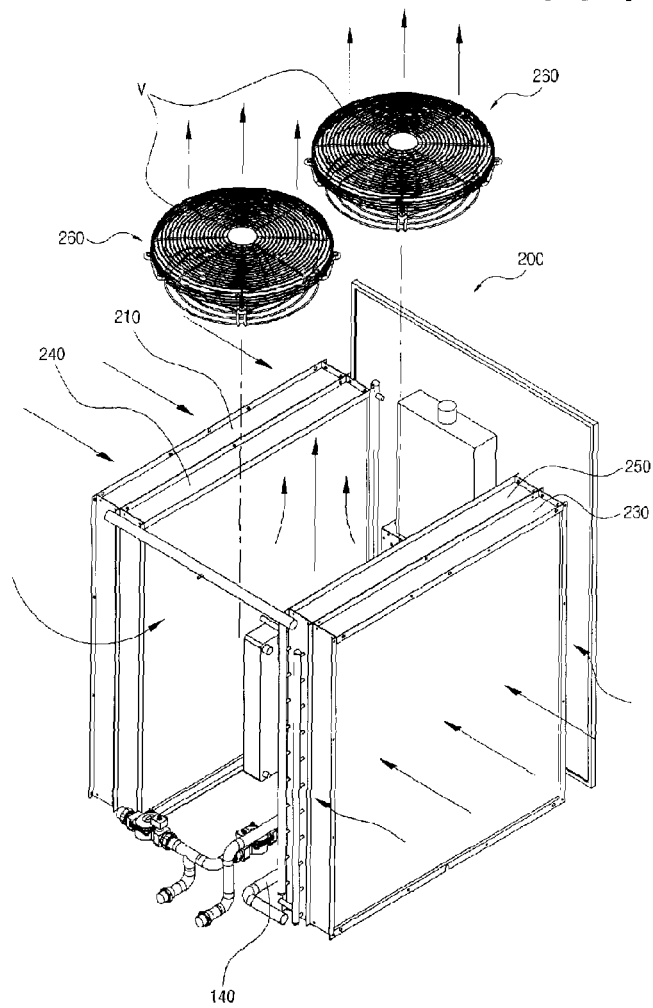
[Fig. 2]
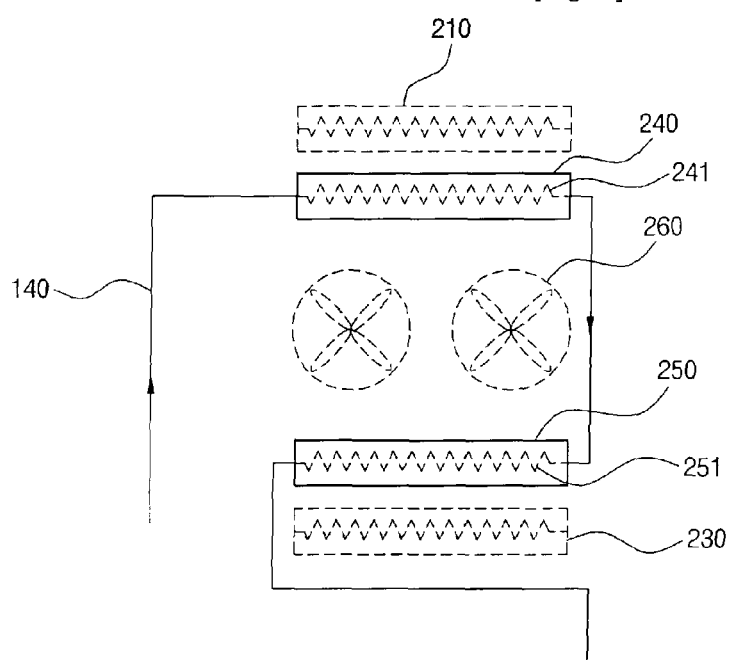
[Fig. 3]

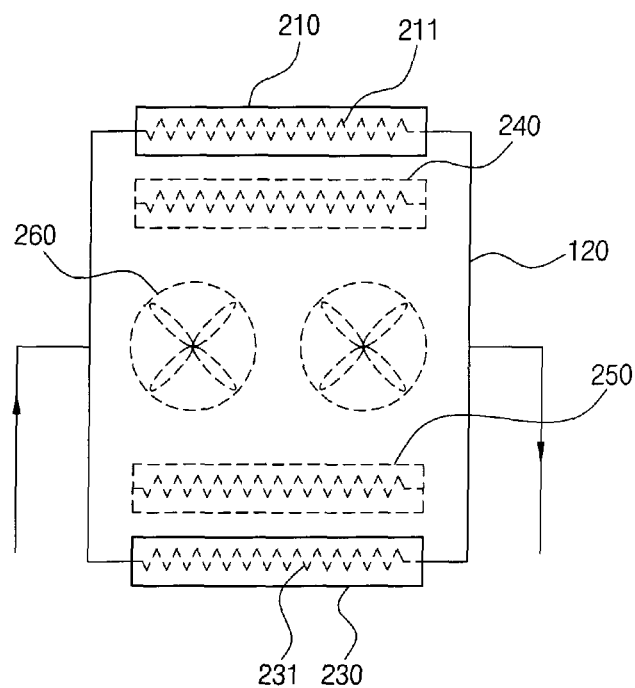
[Fig. 4]
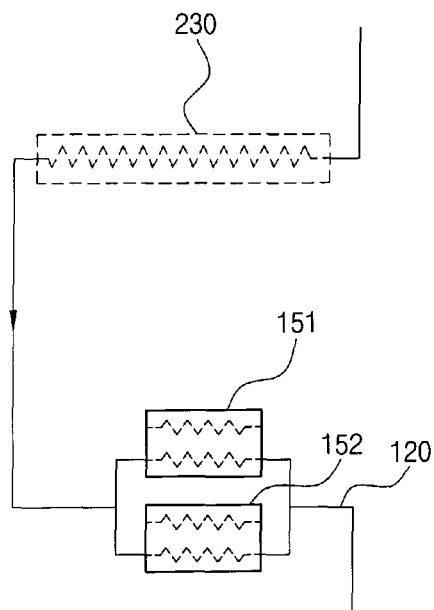
[Fig. 5]

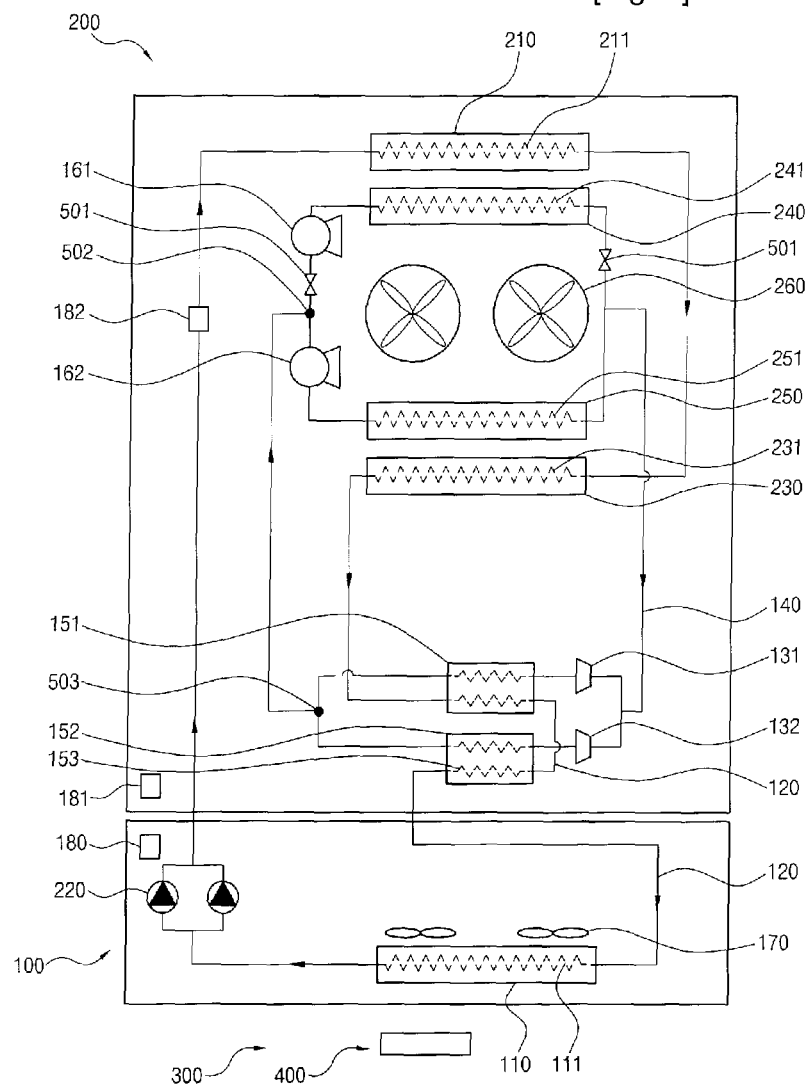
[Fig. 6]

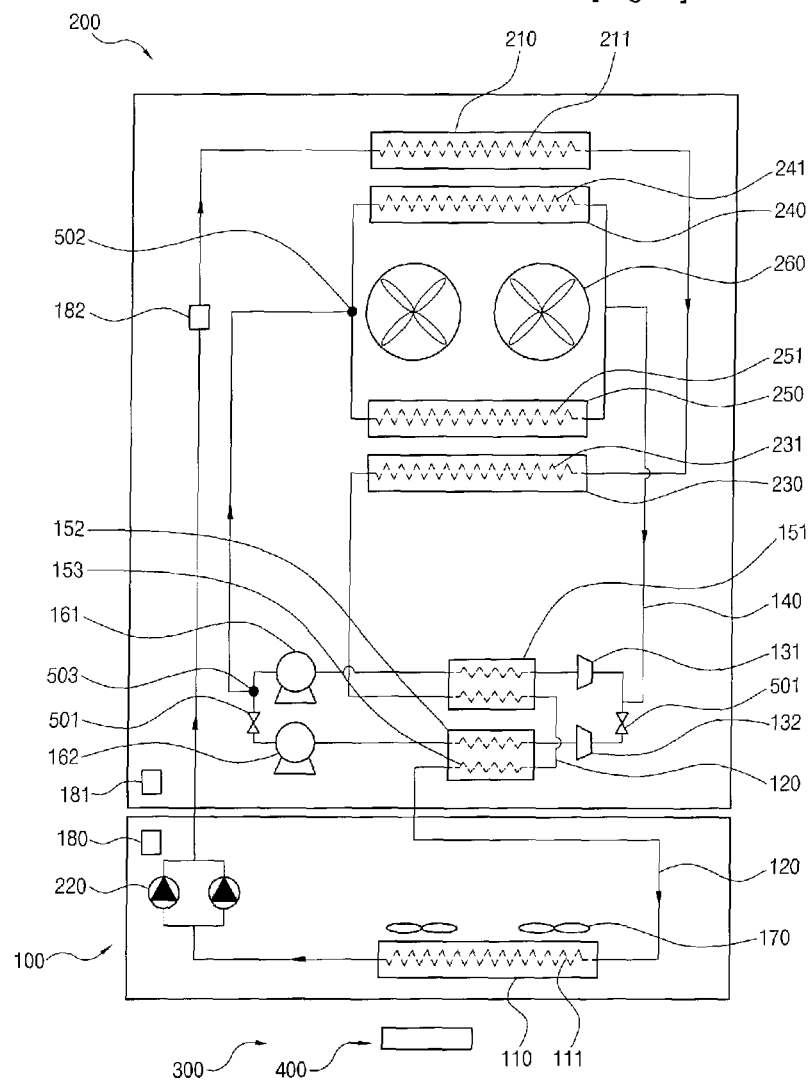
[Fig. 7]

AIR CONDITIONING SYSTEM FOR COMMUNICATION EQUIPMENT

TECHNICAL FIELD

The present invention relates to an air conditioner for communication equipment, and more particularly, to an air conditioner for communication equipment, which has a comparative small size and steadily protects the communication equipment from noise, overheating, and malfunctioning, and a control method thereof.

BACKGROUND ART

In general, an air conditioner uses the heat of evaporation, which extracts heat from a peripheral area when refrigerant is evaporated. The air conditioner commonly uses ammonia, Freon gas, azeotropic refrigerant mixture, and chloromethyle, which are easily evaporated even at a normal temperature, as refrigerant.

The air conditioner generally includes a compressor, a condenser, an expansion valve, a capillary tube, and an evaporator. The compressor compresses a gaseous refrigerant at a high pressure and outputs the compressed gaseous refrigerant to the condenser. The condenser condenses the compressed gaseous refrigerant to a liquid refrigerant through exchanging heat with external air. The liquid refrigerant is transformed to low pressure atomized refrigerant through the expansion valve and the capillary tube.

Then, the low pressure atomized refrigerant flows in the evaporator. The evaporator evaporates the refrigerant to exchange heat with internal air. The evaporated refrigerant flows in the compressor again. As described above, the refrigerant circulates through the compressor, the condenser, the expansion value, and the evaporator. The evaporation heat of refrigerant, which is generated from the evaporator, cools the air down, and a ventilation fan ventilates the cool air to a predetermined space or to a target object to cool down.

As described above, the conventional air conditioner cools down a predetermined space or a target object using refrigerant that can be easily transformed in phase, for example, liquefaction and evaporation.

In general, a plurality of wired/wireless communication equipment is disposed in a communication base station and a communication vehicle. The communication equipment constantly generates the certain amount of heat. Such heat may cause the communication equipment to malfunction. Therefore, it is required to cool down the communication equipment 24-hours a day and 7-days a week in order to stably operate the communication equipment.

In order to cool down the communication equipment, an air conditioner is used. However, the conventional air conditioner is driven only by electric power from an external power source without properly using outdoor cool air which naturally sustains a cool temperature according to an outdoor temperature. Therefore, the conventional air conditioner has a disadvantage of large power consumption.

DISCLOSURE OF INVENTION

Technical Problem

An embodiment of the present invention is directed to providing an air conditioner for communication equipment and a control method thereof in order to reduce the size and the noise thereof, minimize power consumption by properly using an nature chill air according to outdoor temperature, stably sustain the cooling state of the communication equipment, and improve the heat radiating efficiency of a hot section (radiator) in a cooling cycle through a dual heat exchange structure.

Other objects and advantages of the present invention can be understood by the following description, and become apparent with reference to the embodiments of the present invention. Also, it is obvious to those skilled in the art of the present invention that the objects and advantages of the present invention can be realized by the means as claimed and combinations thereof.

Technical Solution

In accordance with an aspect of the present invention, there is provided an air conditioner for communication equipment, including an indoor module disposed at an indoor space of a base station having communication equipment and including an indoor heat exchanger and an indoor ventilator disposed closely to the indoor heat exchanger; an outdoor module disposed at an outside of the base station and including an outdoor ventilator; a brine cooling cycle including the indoor heat exchanger on a brine pipe, a brine pump, first and second outdoor brine heat exchanger, and first and second brine coolers, which are connected in a brine circulating direction; and a refrigerant cooling cycle including first and second expansion valves on a refrigerant pipe, the first and second brine coolers on the brine pipe, first and second compressors, rust and second outdoor refrigerant heat exchangers, which are connected in a refrigerant circulating direction, wherein the first and second expansion valves are connected in parallel on the refrigerant pipe, and the first and second brine coolers are connected in parallel on the refrigerant pipe, wherein the first outdoor brine heat exchanger is disposed closely to the first outdoor refrigerant heat exchanger, and the second outdoor brine heat exchanger is disposed closely to the second outdoor refrigerant heat exchanger, wherein the outdoor ventilator is disposed between the first outdoor refrigerant heat exchanger and the second outdoor heat exchanger, and wherein the brine pump, the first and second brine coolers, the first and second expansion valves, and the first and second compressors are selectively included in one of the indoor module and the outdoor module.

An air conditioner for communication equipment according to an embodiment of the present is physically divided into an indoor module and an outdoor module. Expansion valves, an evaporator, a compressor, and a condenser are distributed in the indoor module and the outdoor module. Herein, the evaporator may be referred as a heat exchanger, a heat absorber, and a cold section. The condenser may be referred as a heat exchanger, a heat radiator, and a hot section. A cooling cycle includes a brine cooling cycle and a refrigerant cooling cycle. The brine cooling cycle directly cools communication equipment down. The radiator of the brine cooling cycle includes first and second outdoor brine heat exchangers using outdoor air and first and second brine coolers of a refrigerant cooling cycle, thereby selectively cooling brine.

In a radiator, an outdoor ventilator improves heat radiating efficiency by circulating outdoor air sequentially through the first outdoor brine heat exchanger and the first outdoor refrigerant heat exchanger to the outside, or circulating outdoor air sequentially through the second outdoor brine heat exchanger and the second outdoor refrigerant heat exchanger to the outside.

ADVANTAGEOUS EFFECTS

An air conditioner for communication equipment and a control method thereof according to an embodiment of the present invention can reduce the size and the noise thereof, minimize power consumption by properly using an nature chill air according to outdoor temperature, stably sustain the cooling state of the communication equipment, and improve the heat radiating efficiency of a hot section (radiator) in a cooling cycle through a dual heat exchange structure.

BRIEF DESCRIPTION OF THE DRAWINGS

FIG. 1 is a diagram illustrating an air conditioner for communication equipment according to an embodiment of the present invention.

FIG. 2 is a perspective view illustrating a dual heat exchange structure of an outdoor module in an air conditioner for communication equipment according to an embodiment of the present invention.

FIG. 3 is a diagram illustrating the serial connection of a first outdoor heat exchanger and a second outdoor heat exchanger in an air conditioner for communication equipment according to an embodiment of the present invention.

FIG. 4 is a diagram illustrating the parallel connection of a first outdoor heat exchanger and a second outdoor heat exchanger in an air conditioner for communication equipment according to an embodiment of the present invention.

FIG. 5 is a diagram illustrating the parallel connection of first and second brine coolers on brine pipes in an air conditioner for communication equipment according to an embodiment of the present invention.

FIG. 6 is a diagram illustrating an air conditioner for communication equipment according to another embodiment of the present invention.

FIG. 7 is a diagram illustrating an air conditioner for communication equipment according to still another embodiment of the present invention.

BEST MODE FOR CARRYING OUT THE INVENTION

The advantages, features and aspects of the invention will become apparent from the following description of the embodiments with reference to the accompanying drawings, which is set forth hereinafter.

FIGS. 1 and 2 show an air conditioner according to an embodiment 1-0 of the present invention. The air conditioner according to the present embodiment includes a brine cooling cycle and a refrigerant cooling cycle.

The brine cooling cycle is formed by connecting first and second outdoor brine heat exchangers 210 and 230, brine coolers 151 and 152, an indoor heat exchanger 110, and a brine pump 220 through a brine pipe 120. The first and second outdoor brine heat exchangers 210 and 230 and the brine coolers 151 and 152 are equivalent to a radiator and an expansion valve in a cooling cycle. The indoor heat exchanger 110 is equivalent to a heat absorbing unit, and the brine pump 220 is equivalent to a compressor in a cooling cycle.

The refrigerant cooling cycle is formed by connecting first and second expansion valves 131 and 132, first and second brine coolers 151 and 152, first and second compressors 161 and 162, and first and second refrigerant heat exchangers 240 and 150 through a refrigerant pipe 140.

The first and second brine coolers 151 and 152 are commonly used by the refrigerant cooling cycle and the brine cooling cycle. That is, the first and second brine coolers 151 and 152 are connected to both of the refrigerant pipe 140 and the brine pipe 120. In the refrigerant cooling cycle, the first and second brine coolers 151 and 152 operate as a heat absorbing unit. On the contrary, the first and second brine coolers 151 and 152 operate as a radiator in the brine cooling cycle.

Physically, the air conditioner according to the present embodiment includes an indoor module 100 disposed at an indoor space of a base station 300 and an outdoor module 200 disposed at an outdoor space of the base station 300.

The parts of the brine cooling cycle and the refrigerant cooling cycle may be distributed in the indoor module 100 and the outdoor module 200 in various manners. FIG. 1 shows one exemplary embodiment thereof.

The indoor module 100 includes an indoor heat exchanger 110, an indoor ventilator 170, and a brine pump 220.

The indoor heat exchanger 110 is disposed on the brine pipe 120 and include a heat exchange tube 111 connected to the brine pipe 120.

The indoor ventilator 170 is disposed closely to a heat transfer surface where heat exchange occurs. Accordingly, the indoor ventilator 170 effectively circulates a cool air, which is cooled down by the indoor heat exchanger 110, in a direction to the communication equipment 400. Therefore, the indoor ventilator 170 maximizes the heat exchange efficiency.

The brine pump 220 is disposed on the brine pipe 120 that extends from the indoor heat exchanger 110 of the indoor module 100. The brine pump 220 circulates the brine through the brine pipe 120. The brine pump 220 includes a pair of the brine pumps connected in parallel to stably cool down the communication equipment 400 in the base station 300 by driving one of the brine pumps if the other is out of order. However, the brine pump 200 may be embodied as one brine pump. Also, it is preferable that the brine pump 200 includes control values independently disposed at the inlet and the outlet thereof to properly control the flow quantity of brine.

The outdoor module 200 includes the first and second outdoor brain heat exchangers 210 and 230, and the first and second brine coolers 151 and 152, which are disposed on the brine pipe 120. The outdoor module 200 also includes the first and second expansion valves 131 and 132, the first and second brine coolers 151 and 152, the first and second compressors 161 and 162, and the first and second outdoor refrigerant heat exchangers 240 and 250, which are disposed on the refrigerant pipe 140.

Hereinafter, the parts of the brine cooling cycle in the outdoor module will be described at first. The first outdoor brine heat exchanger 210 is disposed in the outdoor module 200. The first outdoor brine heat exchanger 210 is connected to the brine pump 220 in the indoor module 100 through the brine pipe 120. The first outdoor brine heat exchanger 210 radiates heat through exchanging heat with the outside air. Basically, the temperature of the outside air must be lower than the temperature of the brine in order to radiate heat.

The second outdoor brine heat exchanger 230 is disposed in the outdoor module 200. The second outdoor brine heat exchanger 230 include an inlet side connected to the first outdoor brine heat exchanger 210 and the brine pipe 120 and an outlet side connected to the first brine cooler 141 in an outlet side, thereby radiating heat by contacting the outside air. That is, since the first and second outdoor brine heat exchangers 210 and 230 are connected in series, such a structure makes the brine to doubly pass through the first and second outdoor brine heat exchangers 230 and 250, thereby maximizing the heat radiating efficiency of the outdoor brine heat exchanger.

The first brine cooler 151 includes an inlet side connected to the second outdoor brine heat exchanger 230 and the brine pipe, and an outlet side connected to the second brine cooler 152. Since the refrigerant of the refrigerant pipe flows in the first brine cooler 151 as a heat absorbing unit, the refrigerant cools the brine down.

The second brine cooler 151 includes an inlet side connected to the first brine cooler 151 and the brine pipe 120, and an outlet side connected to the indoor heat exchanger 110 of the indoor module 100. Since the refrigerant of the refrigerant pipe flows through the second brine cooler 152 as the heat absorbing operation of the heat absorbing unit, the refrigerant of the refrigerant pipe cools the brine down again. That is, the first brine cooler 151 and the second brine cooler 152 are connected in series. Such a structure makes the brine to doubly pass through the first and second brine coolers 151 and 152. Therefore, the cooling degree of the brine can be selectively controlled. Meanwhile, the first and second brine coolers 151 and 152 are connected in parallel on the refrigerant pipe. Therefore, the refrigerant is divided at and entered into the inlet side of the first and second brine coolers, and the refrigerant is merged at and flows out from the outlet side of the first and second brine coolers.

The brine is a solution or a liquid having a low freezing point, such as $CaCl_2$ and NaCl, and usually it is used in the indirect freezing method.

Hereinafter, the parts in the refrigerant cooling cycle will be described. The first and second expansion valves 131 and 132 are disposed on the refrigerant pipe 140 and transforms high pressure liquid refrigerant supplied from the refrigerant pipe 140 to low temperature and low pressure atomized refrigerant. The first and second expansion valves 131 and 132 are connected in parallel. In the present embodiment, general refrigerant such as Freon gas, ammonia, azeotropic refrigerant mixture, and chloromethyle is used as the refrigerant.

The first brine cooler 151 internally includes a heat exchanging tube 153 and is connected to the refrigerant pipe 140 extending from the first expansion valve 131. The first brine cooler 151 is an evaporator for evaporating low pressure atomized refrigerant and cooling down the brine using the evaporation heat of the refrigerant.

The second brine cooler 152 internally includes a heat exchange tube 153 and is connected to a refrigerant pipe 140 extending from the second expanding valve 132. The second brine cooler 152 is an evaporator for evaporating low pressure atomized refrigerant and cooling down the brine using the evaporation heat of the refrigerant. The first and second brine coolers 151 and 152 are connected in parallel on the refrigerant pipe 140. Also, the first and second brine coolers 151 and 152 are connected in parallel or in series on the brine pipe 120.

The first and second compressors 161 and 162 are connected in parallel. The first and second compressors 161 and 162 are connected to the refrigerant pipe 140 extending from the first and second brine coolers 151 and 152 in order to compress refrigerant merged at a merge point 503 after passing through the first and second brine coolers 151 and 152. The first and second compressors 161 and 162 are a typical compressor for compressing the evaporated refrigerant at high pressure. Meanwhile, since the first and second compressors 161 and 162 are connected in parallel, it is possible to stably sustain the cooling state of the communication equipment 400 in the base station 300 by driving one of the first and second compressors 161 and 162 if the other is out of order. It is preferable that the first and second compressors 161 and 162 include control valves individually disposed at the inlet and the outlet thereof in order to properly control the flow quantity of brine.

The first and second outdoor heat exchangers 240 and 250 internally include heat exchange tubes 241 and 245 and are connected in parallel. The first outdoor refrigerant heat exchanger 240 is disposed at one side of the refrigerant pipe 140 branched from a branch point 502 at the outlet of the first and second compressors 161 and 162, and disposed closely to the first outdoor brine heat exchanger 210 on the brine pipe 120. The second outdoor refrigerant heat exchanger 250 is disposed at the other end of the refrigerant pipe 140 branched from the branch point 502 and disposed closely to the second outdoor brine heat exchanger 230 on the brine pipe 120. In more detail, the first and second outdoor brine heat exchangers 210 and 230 are disposed in an inflow direction of the outside air in order to contact the outside air. The first and second outdoor refrigerant heat exchangers 240 and 250 are a condenser for condensing and liquidizing the high pressure refrigerant from the first and second compressors 161 and 162. The refrigerant pipes are merged and divided again at the first and second outdoor refrigerant heat exchangers 240 and 250. The divided refrigerant pipes are connected to the first and second expansion valves 131 and 132.

When the outdoor heat exchangers are installed at an outside air inflow side, the first and second outdoor brine heat exchangers 210 and 230 are disposed at the outside and the first and second outdoor refrigerant heat exchangers 240 and 250 are disposed at the inside as shown in FIG. 2. On the contrary, when the outdoor heat exchanges are disposed at an inside air outflow side, the first and second outdoor brine heat exchangers 210 and 230 are disposed at the inside, and the first and second outdoor refrigerant heat exchangers 240 and 250 are disposed at the outside.

An outdoor ventilator 260 is disposed closely to a heat transfer surface where the first and second outdoor brine heat exchangers 210 and 230 and the first and second outdoor refrigerant heat exchangers 240 and 250 change heat. Therefore, the outdoor ventilator 260 maximizes the efficiency of contacting the outside air and heat-exchanging with the outside air in the outdoor heat exchangers 210, 230, 240, and 250.

As one embodiment of the present invention, the first and second outdoor refrigerant heat exchangers 240 and 250 are disposed at a predetermined distance to face each other in a direction to the inside of the outdoor module 200. The outdoor ventilator 260 is interposed between the first and second outdoor refrigerant heat exchangers 240 and 250. The first and second outdoor brine heat exchangers 210 and 230 are disposed at the outside of the first and second outdoor refrigerant heat exchangers 240 and 250 to face the first and second outdoor refrigerant heat exchangers 240 and 250. Herein, the outside denotes the outside direction of the outdoor module 200, that is, a direction to the outside air inflow side of the outdoor module 200. Such arrangement of the heat exchangers 210, 230, 240, and 250 improves space efficiency for reducing the size of the outdoor module 200. Also, since such arrangement requires less number of outdoor ventilators 260, the noise of the outdoor module 200 can be reduced.

The outdoor ventilator 260 is disposed at the middle between the first and second outdoor refrigerant heat exchangers 240 and 250, for example, the upper center of the outdoor module 200 as shown in FIG. 2. When the outdoor ventilator 260 operates, the outdoor ventilator sucks in the outside air from the outside air inlets, for example, disposed at the left and the right side of the heat exchangers 210 and 230 as shown in FIG. 2. Then, the outdoor ventilator 260 discharges the outside air to a ventilation pipe V. Therefore, the outside air sequentially passes through the first and second outdoor brine heat exchangers 210 and 230, and the first and second outdoor refrigerant heat exchangers 240 and 250, and is ventilated to the outside again.

Such arrangement of the heat exchangers and the outdoor ventilator makes the outside air to pass through the first and second outdoor brine heat exchangers 210 and 230, which are comparatively low temperature, before the first and second outdoor refrigerant heat exchangers 240 and 250. That is, such arrangement prevents the heat exchange efficiency of the first and second outdoor brine heat exchangers 210 and 230 from decreasing if the outside air passes through the first and second outdoor refrigerant heat exchangers 240 and 250 which are comparative high temperature before passing through the first and second outdoor brine heat exchangers 210 and 230.

FIGS. 3 to 5 show serial and parallel connections of first and second outdoor refrigerant heat exchangers 240 and 250, and first and second outdoor brine heat exchangers 210 and 230 according to other exemplary embodiments of the present invention.

Based on the embodiment 1-0 shown in FIG. 1, the serial and parallel connections of the first and second outdoor refrigerant heat exchangers 240 and 250, the first and second outdoor brine heat exchangers 210 and 230, and the first and second brine coolers 151 and 152 on a brine pipe can be embodied in various ways. Table 1 shows various serial and parallel connections thereof.

connection to the parallel connection compared to the embodiment 1-0. The embodiment 1-2 can be reconfigured through FIGS. 1 and 5. The parallel connection of the first and second brine coolers 151 and 152 on the brine pipe is divided at the inlet side of the brine pipe 120 and merged at the outlet side thereof. The first brine cooler 151 is disposed at one side of the divided brine pipe 120, and the second brine cooler 152 is disposed at the other side of the divided brine pipe 120.

In the embodiment 1-4, the connection of the first and the second refrigerant heat exchangers 240 and 250 changes from the parallel connection to the serial connection compared to the embodiment 1-0. The embodiment 1-4 can be reconfigured through FIGS. 1 and 3. A refrigerant pipe 140 at the outlet side of the first outdoor refrigerant heat exchanger 240 is connected to a refrigerant pipe 140 at the inlet side of the second outdoor refrigerant heat exchanger 250, thereby improving the heat radiating capacity of the refrigerant cooling cycle.

Embodiments 1-3, 1-5, 1-6, and 1-7 may be reconfigured as described above. In the embodiment 1-3, the connections of the first and second outdoor brine heat exchangers 210 and 230 and the first and second brine coolers 151 and 152 change from the serial connection to the parallel connection based on the embodiment 1-0. In the embodiment 1-5, the connection of the first and second outdoor refrigerant heat exchangers 240 and 250 changes from the parallel connection to the serial connection, and the connection of the first and second outdoor brine heat exchangers 210 and 230 changes from the serial connection to the parallel connection based on the embodiment 1-0. In the embodiment 1-6, the connection of the first and second outdoor refrigerant heat exchanger 240 and 250 changes from parallel to serial, and the connection of the first and second brine coolers 151 and 152 changes from serial to parallel based on the embodiment 1-0. In the embodiment 1-7, the connection of the first and second outdoor refrigerant

TABLE 1

| embodiment | connection of first and second outdoor refrigerant heat exhcangers | connection of first and second outdoor brine heat exchangers | connection of first and second brine coolers on brine pipe | reference |
| --- | --- | --- | --- | --- |
| 1-0 | parallel | serial | serial | FIG. 1 |
| 1-1 | parallel | parallel | serial | FIGS. 1, 4 |
| 1-2 | parallel | serial | parallel | FIGS. 1, 5 |
| 1-3 | parallel | parallel | parallel | FIGS. 1, 4, 5 |
| 1-4 | serial | serial | serial | FIGS. 1, 3 |
| 1-5 | serial | parallel | serial | FIGS. 1, 3, 4 |
| 1-6 | serial | serial | parallel | FIGS. 1, 3, 5 |
| 1-7 | serial | parallel | parallel | FIGS. 1, 3, 4, 5 |

Hereinafter, the embodiments 1-1 to 1-7 will be described based on differences with the embodiment 1-0.

In the embodiment 1-1, the connection of the first and second heat exchangers 210 and 230 changes from the serial connection to the parallel connection. The embodiment 1-1 can be reconfigured through FIGS. 1 and 4. The parallel connection of the first and second outdoor brine heat exchangers 210 and 230 is divided at the inlet side of the brine pipe 120 and merged at the outlet side thereof. The first outdoor brine heat exchanger 210 is disposed at one side of the divided brine pipe 120, and the second outdoor brine heat exchanger 230 is disposed at the other side of the divided brine pipe 120.

In the embodiment 1-2, the connection of the first and second brine coolers 151 and 152 changes from the serial heat exchangers 240 and 250 changes from parallel to serial, and the connection of the first and second outdoor brine heat exchangers 210 and 230 and the connection of the first and second brine coolers 151 and 152 changes from serial to parallel based on the embodiment 1-0.

FIG. 6 is a diagram illustrating an air conditioner for communication equipment according to another embodiment of the present invention. That is, FIG. 6 shows an embodiment 2-0. Based on the embodiment 2-0 shown in FIG. 6, the serial and parallel connections of the first and second outdoor brine heat exchangers 210 and 230, and the first and second brine coolers 151 and 152 on a brine pipe can be embodied in various ways. Table 2 shows various serial and parallel connections thereof.

TABLE 2

| embodiment | connection of first and second outdoor refrigerant heat exhcangers | connection of first and second outdoor brine heat exchangers | connection of first and second brine coolers on brine pipe | reference |
|---|---|---|---|---|
| 2-0 | parallel | serial | serial | FIG. 6 |
| 2-1 | parallel | parallel | serial | FIGS. 6, 4 |
| 2-2 | parallel | serial | parallel | FIGS. 6, 5 |
| 2-3 | parallel | parallel | parallel | FIGS. 6, 4, 5 |

The embodiment 2-0 will be described based on the difference from the embodiment 1-0.

As shown in FIGS. 1 and 6, in the embodiment 2-0, the first and second compressors 161 and 162 are disposed under the branch point 502. The first compressor 161 is connected to the inlet side of the first outdoor refrigerant heat exchanger 240 through the refrigerant pipe 140. The second compressor 162 is connected to the inlet side of the second outdoor refrigerant heat exchangers 250 through the refrigerant pipe 140. The compressor 161 and the first outdoor refrigerant heat exchanger 240 can be controlled by a valve 501 and a power switch (not shown).

The embodiments 2-1 to 2-3 will be described based on the differences from the embodiment 2-0.

In the embodiment 2-1 shown in FIGS. 4 and 6, the connection of the first and second outdoor brine heat exchanges 210 and 230 changes from serial to parallel based on the embodiment 2-0. In the embodiment 2-2 shown in FIGS. 6 and 5, the connection of the first and second brine coolers 151 and 152 changes from serial to parallel. In the embodiment 2-3 shown in FIGS. 6, 5 and 4, the connections of the first and second outdoor brine heat exchangers 210 and 230, and the first and second brine coolers 151 and 152 change from serial to parallel.

FIG. 7 is a diagram illustrating an air conditioner for communication equipment according to still another embodiment of the present invention. That is, FIG. 7 shows an embodiment 3-0. Based on the embodiment 3-0 shown in FIG. 7, the serial and parallel connections of the first and second outdoor refrigerant heat exchangers 240 and 250, the first and second outdoor brine heat exchangers 210 and 230, and the first and second brine coolers 151 and 152 on a brine pipe can be embodied in various ways. Table 3 shows various serial and parallel connections thereof.

pipe 140, and the second compressor 162 is connected to the outlet side of the second brine cooler 152 through the refrigerant pipe 140. Therefore, the compressor 161 and the first brine cooler 151 are controlled by the valve 501 and the power switch (not shown).

The embodiments 3-1 to 3-7 will be described based on the differences from the embodiment 3-0.

In the embodiment 3-1 shown in FIGS. 7 and 4, the connection of the first and second outdoor brine heat exchangers 210 and 230 changes from serial to parallel. In the embodiment 3-2, the connection of the first and second brine coolers 151 and 152 changes from serial to parallel. In the embodiment 3-3, the connections of the first and second outdoor brine heat exchangers 210 and 230 and the first and second brine coolers 151 and 152 from serial to parallel based on the embodiment 3-0.

In the embodiment 3-4, the connection of the first and second outdoor refrigerant heat exchangers 240 and 250 changes from parallel to serial based on the embodiment 3-0. In the embodiment 3-5, the connection of the first and second outdoor refrigerant heat exchangers 240 and 250 changes from parallel to serial, and the connection of the first and second outdoor brine heat exchangers 210 and 230 changes from serial to parallel. In the embodiment 3-6, the connection of the first and second outdoor refrigerant heat exchangers 240 and 250 changes from parallel to serial, and the connection of the first and second brine coolers 151 and 152 changes from serial to parallel. In the embodiment 3-7, the connection of the first and second outdoor refrigerant heat exchangers 240 and 250 changes from parallel to serial, and the connection of the first and second outdoor brine heat exchangers 210

TABLE 3

| embodiment | connection of first and second outdoor refrigerant heat exhcangers | connection of first and second outdoor brine heat exchangers | connection of first and second brine coolers on brine pipe | reference |
|---|---|---|---|---|
| 3-0 | parallel | serial | serial | FIG. 7 |
| 3-1 | parallel | parallel | serial | FIGS. 7, 4 |
| 3-2 | parallel | serial | parallel | FIGS. 7, 5 |
| 3-3 | parallel | parallel | parallel | FIGS. 7, 4, 5 |
| 3-4 | serial | serial | serial | FIGS. 7, 3, |
| 3-5 | serial | parallel | serial | FIGS. 7, 3, 4 |
| 3-6 | serial | serial | parallel | FIGS. 7, 3, 5 |
| 3-7 | serial | parallel | parallel | FIGS. 7, 3, 4, 5 |

The embodiment 3-0 will be described based on the difference from the embodiment 1-0.

In the embodiment 3-0 as shown in FIGS. 1 and 7, the first and second compressor 161 and 162 are disposed above the merge point 503. The first compressor 161 is connected to the outlet side of the first brine cooler 151 through the refrigerant and 230, and the connection of the first and second brine coolers 151 and 152 change from serial to parallel.

As described above, if a brine cooling cycle and a refrigerant cooling cycle include a plurality of devices, the air conditioner thereof can be driven optimally by selectively connecting the devices in series or in parallel according to driving conditions.

Hereinafter, a temperature sensor, a controller (not shown), and an operating unit (not shown) for controlling an air conditioner will be described.

In order to effectively control, an indoor temperature sensor 180 is disposed in the indoor of the base station 300, and an outdoor temperature sensor 181 is disposed at the outside of the base station. A brine temperature sensor 182 is disposed at the outdoor module 200. That is, the brine temperature sensor 182 is installed on the brine pipe at the inlet side of the first outdoor heat exchanger 210.

Preferably, the controller is a control device having a microprocessor or PLC. The operating unit includes an air conditioner power switch, power switches for compressors, brine pumps in a brine cooling cycle and a refrigerant cooling cycle, an indoor ventilator switch, an outdoor ventilator switch, and an electric louver for opening and closing a bypass valve or an indoor air inlet.

According to the characteristics of communication equipment and in order to economically operate the communication equipment, it is preferable to sustain the indoor temperature at about 25° C. The outdoor temperature changes according to Spring, Summer, Fall, and Winter. Generally, the indoor temperature is higher than the outdoor temperature due to the communication equipment.

In case of Winter, it is rare to operate the air conditioner because the indoor and the outdoor temperature are about below 25° C.

In case of Spring and Fall, the communication equipment is cooled down by operating only a brine cooling cycle because the outdoor temperature is generally below 25° C. That is, the communication equipment is cooled down using the outside air. In this case, the outside air temperature must be lower than the brine temperature, and the refrigerant cooling cycle is turned off. The first and second outdoor brine heat exchangers 210 and 230 cool the brine down using the outside air, and the cooled brine cools the communication equipment down through the indoor heat exchanger 110.

In case of the Summer, the outdoor temperature is generally higher than about 25° C.

Since the brine temperature is higher, it is not proper to operate the brine cooling system such as the first and second outdoor brine heat exchangers to cool down the communication equipment. In this case, the communication equipment is cooled down by operating the refrigerant cooling system to cool the brine down through the first and second brine coolers 151 and 152.

If necessary, the first and second outdoor brine heat exchangers and the refrigerant cooling cycle may be operated together.

For example, the first, second, and third thresholds for the indoor temperature are set as 25° C., 26.5° C., and 27.5° C., the indoor temperature is sensed using an indoor temperature sensor, and the sensed indoor temperature is compared with the thresholds. Based on the comparison result, it is determined whether compressors are driven or not. Also, the number of compressors to drive is decided according to the comparison result.

If the sensed indoor temperature is lower than the first threshold, both of the refrigerant cooling cycle and the brine cooling cycle are interrupted. If the sensed indoor temperature is higher than the second threshold, the first compressor is driven only. If the sensed indoor temperature is higher than the third threshold, the first and second compressors are driven together.

The refrigerant cooling cycle and the brine cooling cycle may be driven in various ways according to the characteristics of communication equipment, the characteristics of a base station, the characteristics of seasons such as indoor temperature, optimal indoor temperature, brine types, refrigerant types, flow quantity, the performances of devices in a refrigerant cooling cycle, sensors, and the operating unit.

While the present invention has been described with respect to certain preferred embodiments, it will be apparent to those skilled in the art that various changes and modifications may be made without departing from the spirits and scope of the invention as defined in the following claims.

The invention claimed is:

1. An air conditioner for communication equipment, comprising:
    an indoor module disposed at an indoor space of a base station having communication equipment and including an indoor heat exchanger and an indoor ventilator disposed closely to the indoor heat exchanger;
    an outdoor module disposed at an outside of the base station and including an outdoor ventilator;
    a brine cooling cycle including the indoor heat exchanger on a brine pipe, a brine pump, first and second outdoor brine heat exchanger, and first and second brine coolers, which are connected in a brine circulating direction; and
    a refrigerant cooling cycle including first and second expansion valves on a refrigerant pipe, the first and second brine coolers on the brine pipe, first and second compressors, first and second outdoor refrigerant heat exchangers, which are connected in a refrigerant circulating direction,
    wherein the first and second expansion valves are connected in parallel on the refrigerant pipe, and the first and second brine coolers are connected in parallel on the refrigerant pipe,
    the first outdoor brine heat exchanger is disposed closely to the first outdoor refrigerant heat exchanger, and the second outdoor brine heat exchanger is disposed closely to the second outdoor refrigerant heat exchanger,
    the outdoor ventilator is disposed between the first outdoor refrigerant heat exchanger and the second outdoor heat exchanger, and
    the brine pump, the first and second brine coolers, the first and second expansion valves, and the first and second compressors are selectively included in one of the indoor module and the outdoor module.

2. The air conditioner of claim 1, wherein the first and second outdoor brine heat exchangers are disposed in a direction to an outside of the outdoor module, the first and second outdoor refrigerant heat exchangers are disposed in a direction to an inside of the outdoor module, and the outdoor ventilator is disposed at a middle between the first and second outdoor refrigerant heat exchangers.

3. The air conditioner of claim 1, wherein the first and second compressors are disposed at the refrigerant pipe between a branch point and a merge point in parallel;
    the first and second outdoor refrigerant heat exchangers are connected in series or in parallel;
    the first and second outdoor brine heat exchanger are connected in series or in parallel; and
    the first and second brine coolers are disposed in series or in parallel on a brine pipe.

4. The air conditioner of claim 1, wherein the first compressor is disposed at a lower course of a branch point and at a refrigerant pipe extending from an inlet side of the first outdoor refrigerant heat exchanger;
    the second compressor is disposed at a lower course of the branch point and at a refrigerant pipe extending from an inlet side of the second output refrigerant heat exchanger;

the first and second output door brine heat exchangers are connected in series or parallel; and the first and second brine coolers are connected in series or parallel on a brine pipe.

5. The air conditioner of claim 1, wherein the first compressor is disposed at an upper course of a merge point and at a refrigerant pipe extending from an outlet side of the first brine cooler;

the second compressor is disposed at an upper course of the merge point and at a refrigerant pipe extending from an outlet side of the second brine cooler;

the first and second outdoor refrigerant heat exchangers are connected in series or in parallel;

the first and second outdoor brine heat exchangers are connected in series or in parallel; and the first and second brine coolers are connected in series or in parallel on a brine pipe.

6. The air conditioner of claim 2, wherein the first and second compressors are disposed at the refrigerant pipe between a branch point and a merge point in parallel;

the first and second outdoor refrigerant heat exchangers are connected in series or in parallel;

the first and second outdoor brine heat exchanger are connected in series or in parallel; and the first and second brine coolers are disposed in series or in parallel on a brine pipe.

7. The air conditioner of claim 2, wherein the first compressor is disposed at a lower course of a branch point and at a refrigerant pipe extending from an inlet side of the first outdoor refrigerant heat exchanger;

the second compressor is disposed at a lower course of the branch point and at a refrigerant pipe extending from an inlet side of the second output refrigerant heat exchanger;

the first and second output door brine heat exchangers are connected in series or parallel; and the first and second brine coolers are connected in series or parallel on a brine pipe.

8. The air conditioner of claim 2, wherein the first compressor is disposed at an upper course of a merge point and at a refrigerant pipe extending from an outlet side of the first brine cooler;

the second compressor is disposed at an upper course of the merge point and at a refrigerant pipe extending from an outlet side of the second brine cooler;

the first and second outdoor refrigerant heat exchangers are connected in series or in parallel;

the first and second outdoor brine heat exchangers are connected in series or in parallel; and the first and second brine coolers are connected in series or in parallel on a brine pipe.

* * * * *